United States Patent [19]

Taylor et al.

[11] Patent Number: 4,843,137

[45] Date of Patent: Jun. 27, 1989

[54] METHOD FOR MAKING POLYSILANES

[75] Inventors: Richard G. Taylor, Newhaven, United Kingdom; James W. White, Barry, Wales

[73] Assignee: Dow Corning, Ltd., Barry, Wales

[21] Appl. No.: 184,992

[22] Filed: Apr. 22, 1988

[30] Foreign Application Priority Data

May 2, 1987 [GB] United Kingdom ............... 8710531

[51] Int. Cl.$^4$ ................. C08C 77/00; C07F 7/04; C07F 7/08
[52] U.S. Cl. ...................... 528/10; 556/430
[58] Field of Search .............. 423/347; 528/10; 556/430

[56] References Cited

U.S. PATENT DOCUMENTS

| | | | |
|---|---|---|---|
| 2,554,193 | 5/1951 | Hunter | 260/448.2 |
| 2,563,005 | 8/1951 | Clark | 528/43 |
| 2,606,879 | 8/1952 | Clark | 260/2 |
| 3,431,221 | 3/1969 | Hoess | 260/2 |
| 4,260,780 | 4/1981 | West | 556/430 |
| 4,276,424 | 6/1981 | Peterson | 556/430 |
| 4,414,403 | 11/1983 | Schilling et al. | 556/430 |
| 4,497,787 | 2/1985 | Schilling et al. | 423/345 |
| 4,727,170 | 2/1988 | Nagai et al. | 556/430 |

FOREIGN PATENT DOCUMENTS

| | | |
|---|---|---|
| 62-031849 | 2/1987 | Japan . |
| 62-241926 | 10/1987 | Japan . |
| 2077710 | 12/1981 | United Kingdom ............ 423/347 |

OTHER PUBLICATIONS

Eaborn, "Organosilicon Compounds", Butterworth, London (1960), pp. 351–352.
Burkhard, "Polydimethylsilanes", J. Am. Chem. Soc., 71, pp. 963–964.

Primary Examiner—John Doll
Assistant Examiner—Lori S. Freeman
Attorney, Agent, or Firm—James E. Bittell

[57] ABSTRACT

Polysilanes having higher molecular weight are prepared in a higher yield by reacting diorganodihalosilanes with an alkali metal at a temperature of at least 150° C. in a medium which comprises a solvent in which the diorganodihalosilane is soluble. Preferred solvents comprise siloxanes, particularly cyclic dimethylsiloxanes.

7 Claims, No Drawings

METHOD FOR MAKING POLYSILANES

This invention relates to a method for making polysilanes.

Polysilanes and methods for making them have been known for a long time. A method has been described as early as 1924 by F. S. Kipping in J. Chem. Soc. 125, 2291. The first clear description of a preparative method was disclosed by Burkhard in 1949 in J. Am. Chem. Soc., 71, 963, in which he describes the reaction between dimethyldichlorosilane and molten sodium in benzene as solvent giving a polymer having units of the formula $((CH_3)_2Si)$.

There is, however, a continuing search for an improved method for preparing polysilanes and specifically for the manufacture of polysilanes having a high molecular weight. Such polysilanes are useful, for example, in applications involving the absorption of ultraviolet radiation.

According to the prior disclosures the reactions between silanes and alkalimetals, or between disilanes and alkalimetals, have been carried out at temperatures of 110° C. or below. We have now found that if the temperature of reaction is significantly increased, not only can the polysilanes be produced in significantly improved yields, but they are also of higher molecular weight than those obtained by prior art methods.

The invention accordingly provides a method for preparing a polysilane which comprises reacting at a temperature of at least 150° C. one or more diorganodihalosilanes with an alkali metal in a medium which comprises a first solvent for the diorganodihalosilanes.

In the method of the invention diorganodihalosilanes may be used which have the general formula $R_2SiX_2$, wherein each R denotes independently an alkyl group, aryl group or an alkenyl or cycloalkenyl group, having up to 18 carbon atoms and each X denotes a halogen atom, preferably a chlorine atom. Diorganodihalosilanes which are particularly useful in the method of the invention include dimethyldichlorosilane, methylphenyldichlorosilane, diphenyldichlorosilan, n-hexylmethyldichlorosilane, n-decylmethyldichlorosilane, ethylcyclohexenylmethyldichlorosilane and mixtures of 2 or more of these. Such halosilanes are known in the art and many of them are commercially available.

The alkali metal which may be used in the method of the invention is preferably sodium in its molten form.

The first solvent which is used in the method of the invention is one which is capable of dissolving the diorganodihalosilane reactant and also of being employed at a temperature of at least 150° C. Preferably the solvent has a boiling point of at least 150° C. at normal atmospheric pressure (760 mmHg) so that the reaction can be carried out at the required temperature without the need to resort to increased pressure. A variety of such solvents are commercially available and include substances such as mineral oil and polyorganosiloxanes. The polyorganosiloxanes which may be used include those which can be represented by the general formula $Z_3Si\text{-}(O(Z)_2Si)_n\text{-}OSiZ_3$ or $(Z_2SiO)_m$ in which each Z independently denotes a hydrocarbon group having up to 18 carbon atoms, n has a value of at least 1, and m has a value of at least 4. Preferably Z denotes an alkyl, aryl or alkenyl group. Particularly preferred are those polyorganosiloxanes where Z is methyl, phenyl or vinyl. Examples of such polyorganosiloxane materials include dimethylpolysiloxanes, methylphenylpolysiloxanes, dimethylcyclosiloxanes and vinyl-containing methylpolysiloxanes. The most preferred solvents are octamethylcyclotetrasiloxane, decamethylcyclopentasiloxane and mixtures of these.

The actual molecular weight attained in the polysilane product will depend partly on its solubility in the solvent reaction medium, the molecular weight increasing with increasing solubility. This is probably due to the reaction occurring preferentially in the solution. The first solvent is preferably one which is miscible with a second solvent in which the polysilane is not soluble. This has the advantage that if one wishes to extract the polysilane after the reaction, even when the polysilane is soluble in the reaction solvent, this can be done easily by mixing this second solvent with the first solvent after the reaction thereby precipitating the polysilane. A useful second solvent is for example an aliphatic alcohol, such as isopropanol or methanol.

In the method of the invention, the reagents may be added to the solvent in any order, although it is most convenient to add the alkali metal first and to ensure a proper dispersion of the molten metal in the solvent. This dispersion may be carried out for example at the reaction temperature. The reaction temperature should be at least 150° C. The maximum temperature at which the reaction can be carried out is usually restricted by the boiling point of the solvent used. Preferably the reaction is carried out at atmospheric pressure and at a temperature between 150° and 250° C. Generally the higher the temperature the higher the molecular weight of the polysilane which is obtained.

In addition to permitting the use of safer, less flammable, solvents the method of the invention also provides a higher yield of polysilanes than the known prior art methods. Surprisingly it has also been observed that the products have a narrower molecular weight distribution. The molecular weight of the polysilanes produced by the method of the invention can vary depending on the reaction parameters and the ingredients. The method of the invention yields polysilanes having an average weight molecule molecular weight of at least 150,000. Polysilanes having a molecular weight of up to about 1,000,000 have been produced. Polysilanes having up to 1200 silicon atoms and a narrow molecular weight distribution have also been obtained. Polysilanes made by the method of the invention are largely unbranched molecules and are useful as precursors for the formation of ceramics and as photo-resists. They also function as crosslinkers for siloxanes having unsaturated substituents on exposure to ultraviolet radiation.

The following examples, in which Me denotes a methyl group, Ph a phenyl group and Vi a vinyl group and in which all parts and percentages are expressed by weight, unless otherwise stated, illustrate the invention.

EXAMPLE 1

A dispersion of sodium (2.17 g, 10% excess) in vinylmethyl siloxane solvent of the average formula $Vi(Me_2SiO)_{196}(MeViSiO)_4SiMe_2Vi$ was prepared by heating the mixture to 150° C. and stirring the molten sodium vigorously. To this dispersion dichloromethyl n-hexyl silane (9.4 g, 0.0472 M) was added drop wise over 15 minutes while stirring. The temperature rose to 180°–190° C. during the addition and the colour changed from silver grey to intense purple. After the addition was complete the mixture was heated at 150° C. for 5 hours, cooled and allowed to stand at room temperature for 10 hours. Excess sodium was destroyed by careful addition of methanol (20 ml) followed by addition of water (50 ml) to dissolve the salt formed during the reaction. Toluene (30 ml) was added at this stage to aid extraction of the polysilane. The organic layer was separated and washed with water (2×30 ml), dried over magnesium sulphate, filtered and the solvent removed under vacuum to give a milky emulsion of polysilane in siloxane. The siloxane was removed by dissolving the polysilane in tetrahydrofuran and adding the mixture to isopropanol. The polysilane which separated was isolated as a sticky white solid and dried under vacuum for 3-4 hours, giving 3 g of polysilane product which represents a yield of 50%. The polysilane was analysed by gel permeation chromatography, showing a narrow distribution, with a weight average molecular weight of 190,000.

EXAMPLE 2

To a sodium dispersion (12 g, 10% excess) prepared in paraffin oil (30 ml) by heating the mixture to 150° C. and stirring the molten sodium vigorously, dichloromethyl phenyl silane (47 g, 0.246 M) was added drop wise over 15 minutes while stirring. The temperature rose to 200° C. during the addition. After the addition was complete, the mixture was heated at 150° C. for 5 hours, cooled down and allowed to stand at room temperature for 10 hours. Excess sodium was destroyed by careful addition of methanol (20 ml) followed by addition of water (50 ml) to dissolve the salt formed during the reaction. The organic layer was separated and tetrahydrofuran was added to dissolve any solid. This mixture was then added to a large excess of methanol causing the precipitation of the solid polysilane. The polysilane was filtered and washed with 30-40 petroleum ether and dried under vacuum. 17 g of polysilane was obtained which represents a yield of 57% of the theoretical value.

EXAMPLE 3

A dispersion of 7.5 g sodium was prepared in a mixture of octamethylcyclotetrasiloxane and decamethylpentasiloxane solvent (60 g) having a viscosity at 25° C. of 5 mm$^2$/s by heating the mixture to 150° C. and stirring the molten sodium vigorously. To this dispersion dichloromethyl n-octyl silane (0.15 M) was added drop wise over 15 minutes while stirring. The temperature rose to 180°-190° C. during the addition. After the addition was complete the mixture was heated at 160° C. for 5 hours, cooled and allowed to stand at room temperature for 10 hours. Excess sodium was destroyed by careful addition of methanol followed by addition of water to dissolve the salt formed during the reaction. Toluene was added at this stage to aid extraction of the polysilane. The organic layer was separated and washed with water dried over magnesium sulphate, filtered and the solvent removed under vacuum to give a milky emulsion of polysilane in siloxane. The siloxane was removed by dissolving the polysilane in tetrahydrofuran and adding the mixture to isopropanol. The polysilane which separated was isolated as a sticky white solid and dried under vacuum for 3 to 4 hours. A polysilane having an average weight molecular weight of 1,050,000 was obtained in 50% yield.

EXAMPLE 4

Using a method similar to that described in Example 3, except that 0.153 M of decyldichloromethylsilane was used, 9.5 g decylmethylpolysilane was obtained as a sticky material in 34% yield.

EXAMPLE 5

Using a method similar to that described in Example 3, except 0.16 M of dichloroethylcyclohexenylmethylsilane was used, 10.4 g of a white polysilane material was obtained in 43% yield.

That which is claimed is:

1. A method for preparing polysilanes comprising reacting at a temperature of at least 150° C. one or more diorganodihalosilanes with an alkali metal in a medium which comprises a first solvent has a boiling point of silanes, wherein the first solvent has a boiling point of at least 150° C. at normal atmospheric pressure (760 mm Hg).

2. A method according to claim 1 wherein the first solvent is selected from the group consisting of mineral oil, polyorganosiloxane of the general formula $Z_3Si(O(Z)_2Si)_n$-$OSiZ_3$ and polyorganosiloxane of the general formula $(Z_2SiO)_m$, wherein each Z independently denotes a hydrocarbon group having up to 18 carbon atoms, n has a value of at least 1 and m has a value of at least 4.

3. A method according to claim 2 wherein the polyorganosiloxane is selected from the group consisting of octamethylcyclotetrasiloxane, decamethylcyclopentasiloxane and a mixture thereof.

4. A method according to claim 1 which also comprises adding to the reaction mixture, following the reaction, a second solvent in which the polysilane is insoluble and recovering the precipitated polysilane.

5. A method according to claim 4 wherein the second solvent is an aliphatic alcohol.

6. A method according to claim 1 wherein the diorganodihalosilane is a diorganodichlorosilane.

7. A method according to claim 1 wherein the alkali metal is sodium in its molten form.

* * * * *